United States Patent
Starnes et al.

(10) Patent No.: US 6,265,306 B1
(45) Date of Patent: Jul. 24, 2001

(54) RESIST FLOW METHOD FOR DEFINING OPENINGS FOR CONDUCTIVE INTERCONNECTIONS IN A DIELECTRIC LAYER

(75) Inventors: Gregory B. Starnes; Stephen Keetai Park, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/481,828

(22) Filed: Jan. 12, 2000

(51) Int. Cl.$^7$ .............................................. H01L 21/4763
(52) U.S. Cl. ............................................................. 438/632
(58) Field of Search .................................... 438/632, 637, 438/638, 646, 648, 656, 672, 675, 683, 687, 688

(56) References Cited

U.S. PATENT DOCUMENTS 5,096,802 * 3/1992 Hu ........................................ 430/328
5,741,741 * 4/1998 Tseng .................................... 438/637
6,127,098 * 10/2000 Nakagawa et al. .................. 430/315

* cited by examiner

*Primary Examiner*—David Nelms
*Assistant Examiner*—Quoc Hoang
(74) *Attorney, Agent, or Firm*—Williams, Morgan & Amerson, P.C.

(57) ABSTRACT

The present invention is directed to a method of forming semiconductor devices. In one illustrative embodiment, the method comprises defining an opening in a layer of photoresist formed above a layer of dielectric material, heating the layer of photoresist to reduce the size of the opening in the layer of photoresist, and forming an opening in the layer of dielectric material that is defined by the reduced size opening in the layer of photoresist. The method further comprises removing the layer of photoresist and forming a conductive interconnection in the layer of dielectric material.

37 Claims, 4 Drawing Sheets

RESIST FLOW METHOD FOR DEFINING OPENINGS FOR CONDUCTIVE INTERCONNECTIONS IN A DIELECTRIC LAYER

BACKGROUND OF THE INVENTION

1. Field of the Invention

The present invention is generally directed to semiconductor processing, and, more particularly, to a resist flow method for forming openings in a dielectric layer for conductive interconnections.

2. Description of the Related Art

There is a constant drive to reduce the channel length of transistors to increase the overall speed of the transistor, as well as integrated circuit devices incorporating such transistors. A conventional integrated circuit device, such as a microprocessor, is typically comprised of many thousands of semiconductor devices, e.g., transistors, formed above the surface of a semiconducting substrate. For the integrated circuit device to function, the transistors must be electrically connected to one another through conductive interconnections.

Many modeen integrated circuit devices are very densely packed, ie., there is very little space between the transistors formed above the substrate. Thus, these conductive interconnections must be made in multiple layers to conserve plot space on the semiconducting substrate. This is typically accomplished through the formation of a plurality of conductive lines and conductive plugs formed in alternative layers of dielectric materials formed on the device. The conductive plugs are means by which various layers of conductive lines, and/or semiconductor devices, may be electrically coupled to one another. The conductive lines and plugs may be made of a variety of conductive materials, such as copper, aluminum, aluminum alloys, titanium, tantalum, titanium nitride, tantalum nitride, tungsten, etc. These conductive lines and plugs may be formed by a variety of known techniques, e.g., single damascene processing, dual damascene processing, etc.

As stated previously, an integrated circuit device is comprised of many thousands of transistors. An illustrative transistor 10 that may be included in such an integrated circuit device is shown in FIG. 1. The transistor 10 is generally comprised of a gate dielectric 14, a gate conductor 16, and a plurality of source/drain regions 18 formed in a semiconducting substrate 12. The gate dielectric 14 may be formed from a variety of dielectric materials, such as silicon dioxide. The gate conductor 16 may also be formed from a variety of materials, such as polysilicon. The source and drain regions 18 may be formed by one or more ion implantation processes in which a dopant material is implanted into the substrate 12.

One process flow for forming such a device is as follows. A first dielectric layer 26 is formed above the transistor 10, and a plurality of vias or openings 24 are formed in the first dielectric layer 26. Thereafter, the vias 24 are filled with a conductive material, such as a metal, to form contacts 22. In the illustrative transistor 10 shown in FIG. 1, the contacts 22 are electrically coupled to the source and drain regions 18 of the transistor 10. Thereafter, a second dielectric layer 32 may be formed above the first dielectric layer 26. Multiple openings 30 may be formed in the second dielectric layer 32, and the openings 30 may thereafter be filled with a conductive material to form conductive lines 28. Although only a single level of contacts and a single level of conductive lines are depicted in FIG. 1, there may be multiple levels of contacts and lines interleaved with one another. This interconnected network of contacts and lines allows electrical signals to propagate throughout the integrated circuit device. The techniques used for forming the various components depicted in FIG. 1 are known to those skilled in the art and will not be repeated here in detail.

In general, the various features of a semiconductor device, e.g., the gate electrode and the openings for conductive interconnections of a typical field-effect transistor, are manufactured by a continual process of forming various layers of material, selectively removing, or patterning, portions of those layers, and, in some cases, forming additional layers of materials in openings defined in the layers. For example, to form a gate electrode of an illustrative field-effect transistor, a layer of material, such as polysilicon, may be deposited above a surface of a semiconducting substrate. Thereafter, portions of the polysilicon layer are removed, leaving what will become the gate electrode in place above the semiconducting substrate, i.e., the polysilicon layer is patterned to define a gate electrode.

The patterning of these various process layers is typically accomplished using known photolithography and etching process. In general, photolithography is a process in which a layer of photoresist, a material whose structure may be changed upon exposure to a light source, is formed above a process layer in which it is desired to form a feature of a semiconductor device. Essentially, the image that is desired to ultimately be formed in the underlying process layer will first be formed in the layer of photoresist by exposing portions of the photoresist layer to an appropriate light source. Following development of the photoresist layer, the portions of the photoresist layer exposed to the light source will be resistant to subsequent etching processes to be performed on the semiconductor device. The desired features of the semiconductor device are then formed in the underlying process layer by performing one or more wet or dry etching processes to remove the portions of underlying process layer that are not protected by the feature defined in the layer of photoresist.

However, as semiconductor feature sizes continue to decrease, it is desirable to form feature sizes to dimensions that are less than can be directly defined by standard photolithographic processes. In particular, due to the continual trend to produce more densely-pack integrated circuit devices, it is desirable to be able to form conductive interconnections to sizes smaller than can be achieved with traditional photolithographic techniques.

The present invention is directed to a method of making a semiconductor device that mninimizes or reduces some or all of the aforementioned problems.

SUMMARY OF THE INVENTION

The present invention is directed to a method of forming semiconductor devices. In one illustrative embodiment, the method comprises forming a layer of dielectric material, forming a recess in the dielectric layer, and forming a layer of photoresist above the dielectric material and in the recess. The method further comprises forming an opening in the layer of photoresist above the recess, heating the layer of photoresist to reduce the size of the opening in the layer of photoresist, and forming an opening in the layer of dielectric material beneath the recess that is defined by the reduced size opening in the layer of photoresist. The method concludes with the removal of the layer of photoresist and the formation of a conductive interconnection in the recess and the opening in the layer of dielectric material.

BRIEF DESCRIPTION OF THE DRAWINGS

The invention may be understood by reference to the following description taken in conjunction with the accompanying drawings, in which like reference numerals identify like elements, and in which.

Figure 1:
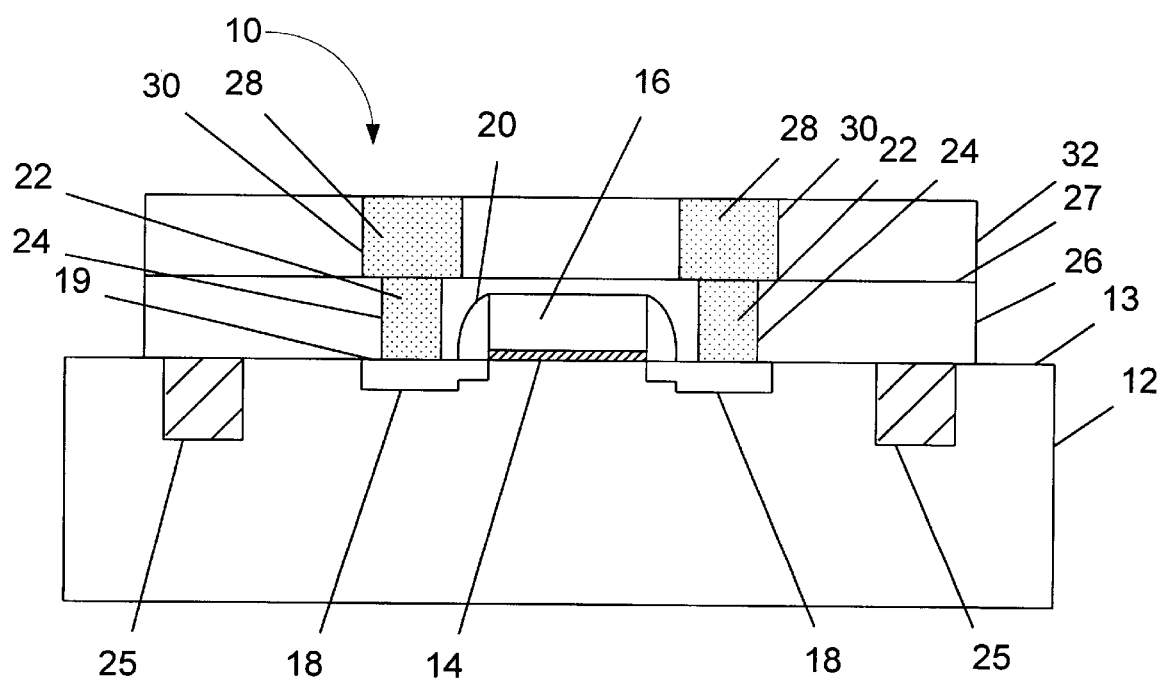
FIG. 1 is a cross-sectional view of an illustrative prior art semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–8. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming conductive interconnections in a dielectric layer in a semiconductor device. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Figure 2:
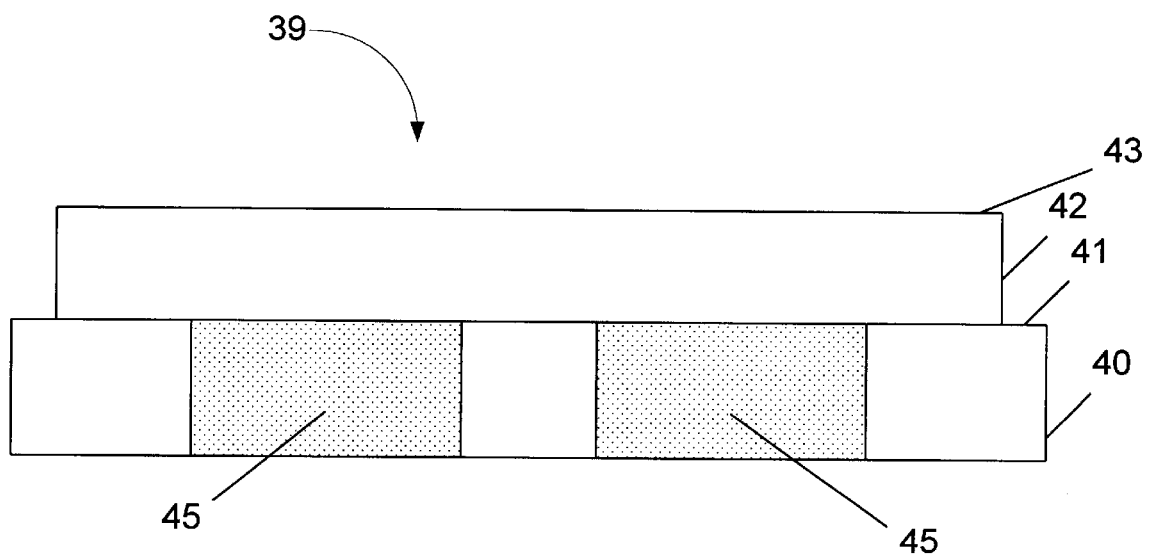
FIG. 2 is a cross-sectional view of a partially formed semiconductor device in accordance with one illustrative embodiment of the present invention.

As shown in FIG. 2, in one illustrative embodiment, a partially formed transistor 39 is comprised of a layer of dielectric material 42 formed above a surface 41 of a structure 40. The structure 40 may be any type of structure found in semiconductor processing operations. The structure 40 may be comprised of a partially formed integrated circuit device (not shown in FIG. 2), or it may be a previous metallization layer formed on an integrated circuit device. For example, the structure 40 may be comprised of all the components of the transistor 10 depicted in FIG. 1 that lie in or below the process layer 26. Alternatively, the structure 40 may be comprised of a metallization layer, such as the components depicted in process layer 32 in FIG. 1. In the illustrative embodiment depicted in FIG. 1, the structure 40 is comprised of a layer of dielectric material having a plurality of conductive lines 45 formed therein.

The dielectric layer 42 may be comprised of any material having a relatively low dielectric constant ("k") that is suitable for use as an insulating layer between conductive interconnections formed on an integrated circuit device, e.g., a material having a dielectric constant less than approximately four. For example, the dielectric layer 42 may be comprised of any low-k material, e.g., silicon dioxide, fluorinated TEOS, carbon-doped oxide, hydrogen silsesquioxane, etc. The dielectric layer 42 may be formed by a variety of known techniques for forming such layers, e.g., physical vapor deposition ("PVD"), chemical vapor deposition ("CVD"), sputtering, etc., and it may have a thickness ranging from approximately 3000–5000 Å. In one illustrative embodiment, the dielectric layer 42 is comprised of a deposited layer of silicon dioxide having a thickness ranging from approximately 2000–6000 Å, typically 2500–3500 Å.

Figure 3:
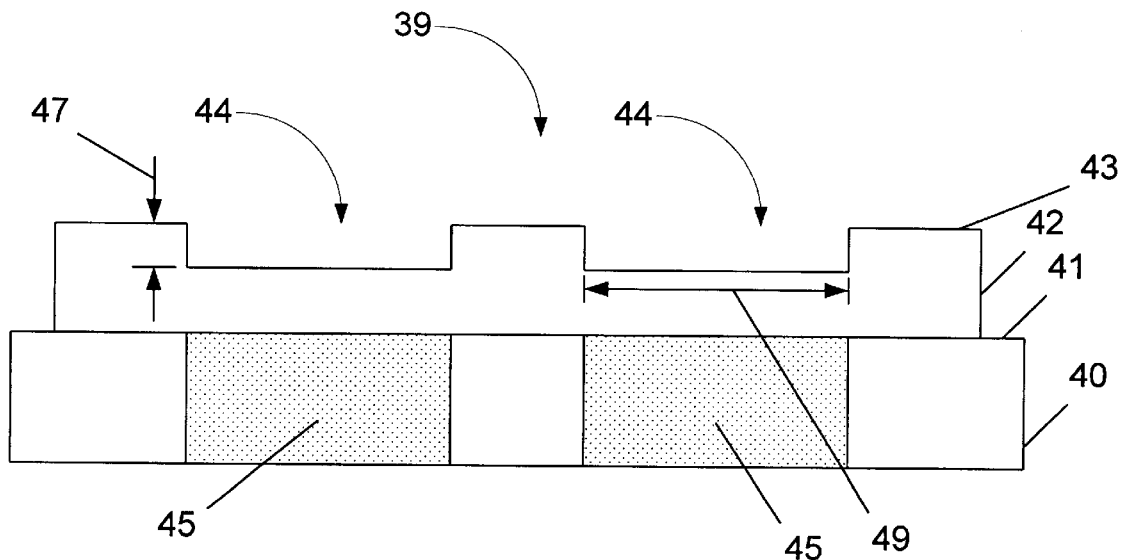
FIG. 3 is a cross-sectional view of the device depicted in FIG. 2 after the layer of dielectric material has been patterned thereabove.

Next, as shown in FIG. 3, a plurality of recesses 44 are formed in the layer of dielectric material 42. The recesses 44 may be formed using known photolithography techniques and one or more etching processes. The depth of the recesses 44 may be varied as a matter of design choice. For example, the depth 47 of the recesses 44 may be approximately one-third of the thickness of the dielectric layer 42. Further, the width 49 of the recesses 44 may be varied as a matter of design choice. In one illustrative embodiment, where a dual damascene technique will be used for forming the conductive interconnections in the dielectric layer 42, the width 49 of the recess 44 corresponds approximately to the desired finished dimension of the conductive line portion of the conductive interconnection.

Figure 4:
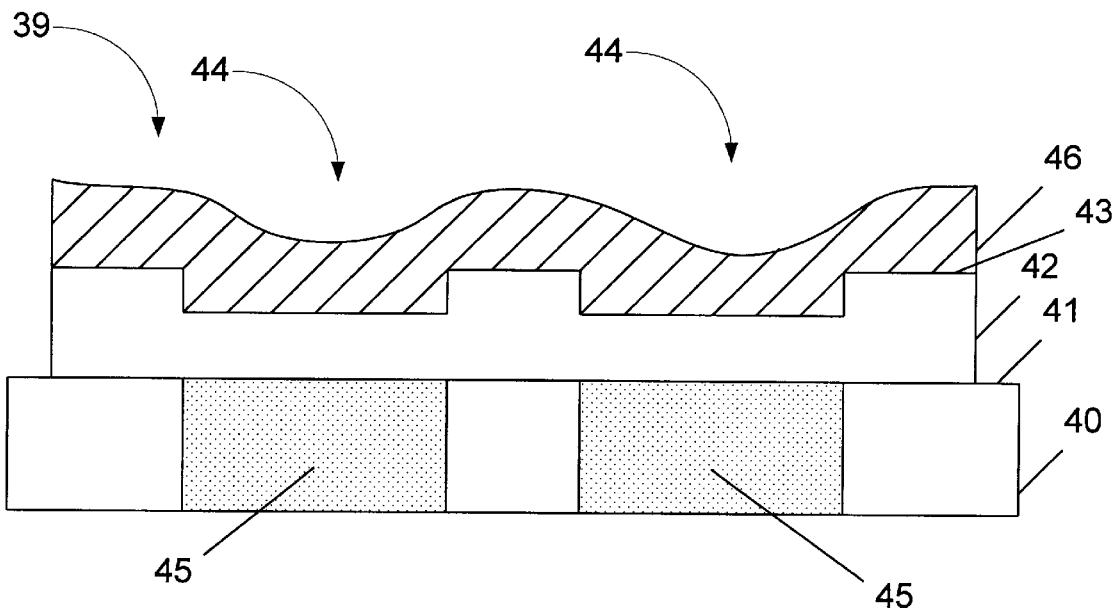
FIG. 4 is a cross-sectional view of the device depicted in FIG. 3 after a layer of photoresist has been formed thereabove.
Figure 5:
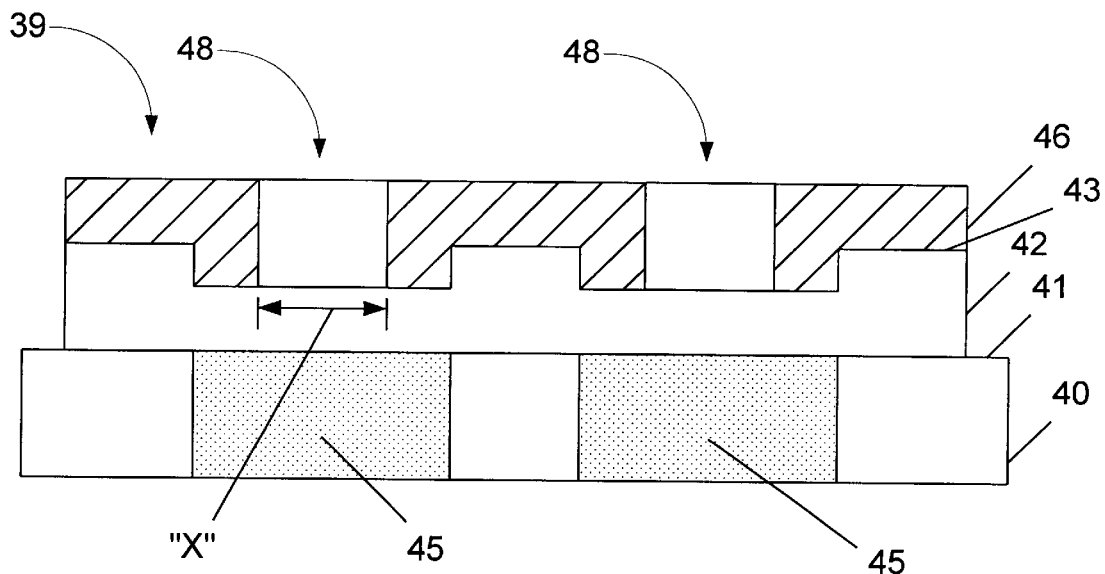
FIG. 5 is a cross-sectional view of the device depicted in FIG. 4 after a plurality of openings have been formed in the layer of photoresist.

Next, as shown in FIG. 4, a layer of photoresist 46 is formed above a surface 43 of the dielectric layer 42 and in the recesses 44. The layer of photoresist may be formed by a variety of techniques, e.g., spin-coating the photoresist on the surface of the wafer. The thickness of the layer of photoresist may range from approximately 4000–8000 Å. Next, as shown in FIG. 5, a plurality of openings 48 are formed in the layer of photoresist 46 using known photolithographic techniques. That is, portions of the layer of photoresist 46 are selectively exposed to a light source to convert the photoresist from a soluble form to a relatively insoluble form that may withstand subsequent processing operations.

During this photolithographic process, the openings 48 are defined so as to have a dimension "X" indicated in FIG. 5. The dimension "X" of the openings 48 depicted in FIG. 5 may be the smallest dimension that may be directly defined using photolithographic processes. The particular size, shape and configuration of the openings 48 depicted in FIG. 5 is provided by way of illustration only. As is known to those skilled in the art, the openings 48 may be of any size, shape or configuration, depending upon the particular feature to be defined in the underlying dielectric layer 44. In one illustrative embodiment where it is desired to form a hole or via (see item 50 in FIG. 7) in the dielectric layer 42, the openings 48 in the layer of photoresist 46 are essentially cylindrical openings defined in the layer of photoresist 46. For situations in which it is desired to define metal lines in the underlying dielectric layer 42, the openings 48 may take the shape of elongated rectangular openings patterned across the surface of the wafer.

Figure 6:
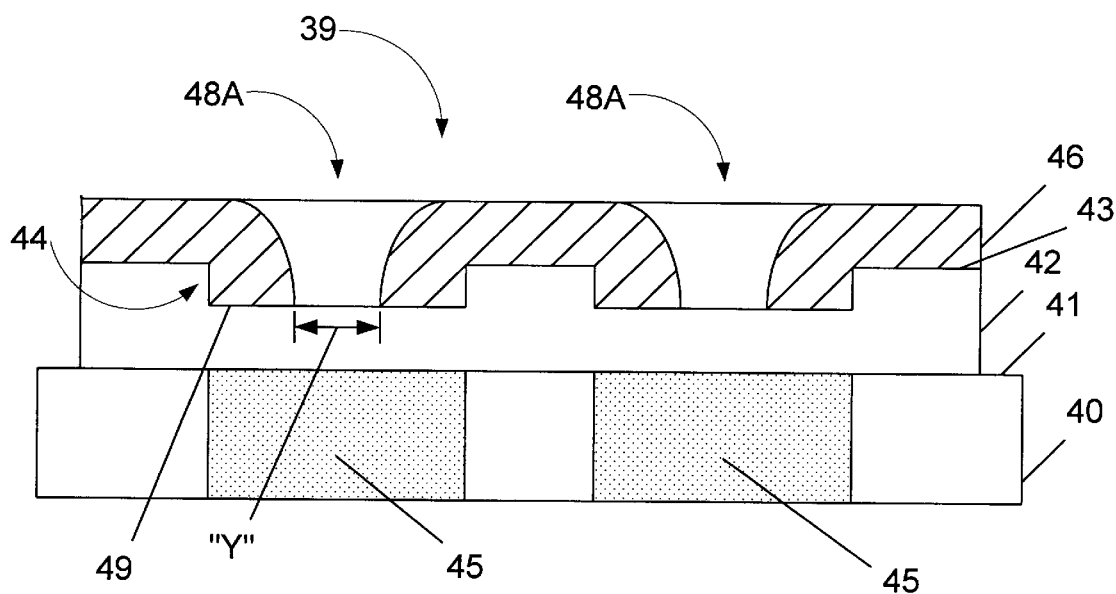
FIG. 6 is a cross-sectional view of the device depicted in FIG. 5 after the layer of photoresist has been subjected to a heating operation.

Next, as shown in FIG. 6, the openings 48 are reduced in size to result in reduced openings 48A. The reduced openings 48A are of a size that is less than may be directly defined using photolithographic processes. The reduced openings 48A may be produced by subjecting the layer of photoresist 46 depicted in FIG. 5 to a heating operation to cause the photoresist to reflow, especially in the area adjacent the reduced openings 48A. Note that, during this reflow process, portions of the layer of photoresist 46 adjacent the opening 48 flows into the area defined by the opening 48, thereby reducing the size of the opening 48. In one illustrative embodiment, reflowing the layer of photoresist 46 may be accomplished by subjecting the layer of photoresist 46 to a heating operation at a temperature ranging from approximately 100–200° C. for a duration ranging from approximately 10–120 seconds.

The reduced opening 48A has a dimension "Y" that is less in magnitude than the dimension "X" of the opening 48 depicted in FIG. 5. In the illustrative example depicted in FIGS. 5 and 6, wherein the opening 48 has essentially a circular cross-section, the dimension "Y" represents the approximate diameter of the reduced opening 48A at the point where it intersects a bottom 49 of the recess 44.

The amount and magnitude of the reduction that may be accomplished by the reflow process may be controlled by varying the temperature and/or the duration of the heating process. In one illustrative embodiment of the present invention, the opening 48 may be formed such that the dimension "X" is approximately 2500 Å. After the reflow process described above, the dimension "Y" of the reduced opening 48A may be approximately 2000 Å, i.e., a reduction in feature size of approximately 20%. Of course, the reduction achieved by the present technique, when compared to the original feature size defined in the layer of photoresist 46, may range from approximately 5–10%. Moreover, the present technique may be employed even as strides and improvements are made in photolithography processes that allow smaller and smaller features to be directly defined in a layer of photoresist. Thus, the present invention may be used with future generations of photolithography equipment.

The illustrated reduction between the openings 48 depicted in FIG. 5 and the reduced openings 48A depicted in FIG. 6 is not to scale. It should also be noted that, although the reduced openings 48A depicted in FIG. 6 are represented as having very precise and sharp contours, those skilled in the art will recognize that, during the reflowing process, these features may become more rounded and contoured in shape. Nevertheless, the result is to produce a reduced opening 48A that is smaller in size than a feature size that may be directly defined with then existing photolithography equipment and techniques. Moreover, it is readily apparent that the present invention may be used to form a variety of types of openings of a variety of different sizes in the dielectric layer 42.

Figure 7:
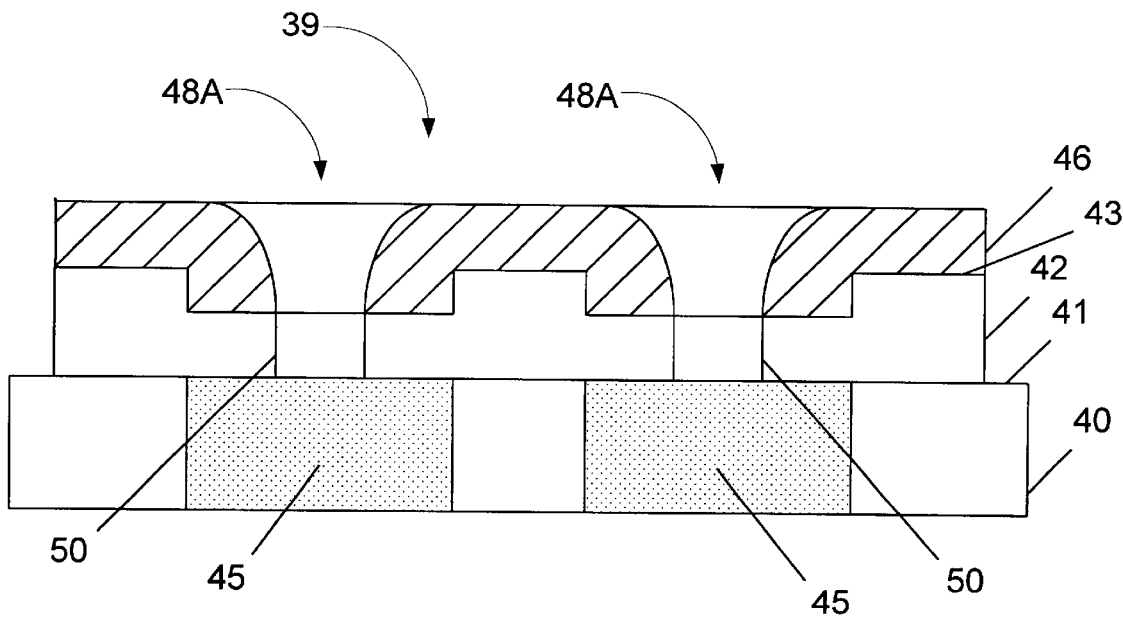
FIG. 7 is a cross-sectional view of the device depicted in FIG. 6 after a plurality of openings have been formed in an underlying dielectric layer.

The structure depicted in FIG. 7 is the result of performing an etching process to define a plurality of openings 50 in the dielectric layer 42. During this process, the layer of photoresist 46 acts as a mask and the opening 50 is formed to a size that corresponds approximately to the minimum size of the reduced opening 48A. The opening 50 may be formed by performing one or more etching processes. The particular etching process and chemistry used may be varied depending upon the composition of the layer of dielectric material 42. For example, an anisotropic plasma etching process may be employed to define the openings 50. After the openings 50 are formed, the residual portions of the photoresist layer 46 may be removed by performing a dilute acid stripping process.

Thereafter, a plurality of conductive interconnections 52 are formed in the area defined by the recess 44 and the opening 50 formed in the dielectric layer 42. The conductive interconnections 52 may be comprised of a variety of materials, such as copper, aluminum, tungsten, etc. The conductive interconnections 52 may be formed by blanket depositing a layer of conductive material above the surface of the wafer, and performing a planarization operation, e.g., a chemical mechanical polishing operation, to produce a planar surface. That is, a chemical mechanical polishing operation may be performed such that a surface 53 of the conductive interconnection 52 is approximately planar with a surface 43 of the dielectric layer 42. In the illustrative example where the conductive interconnection 52 is comprised of copper, the layer of copper may be formed by a plating process.

Figure 8:
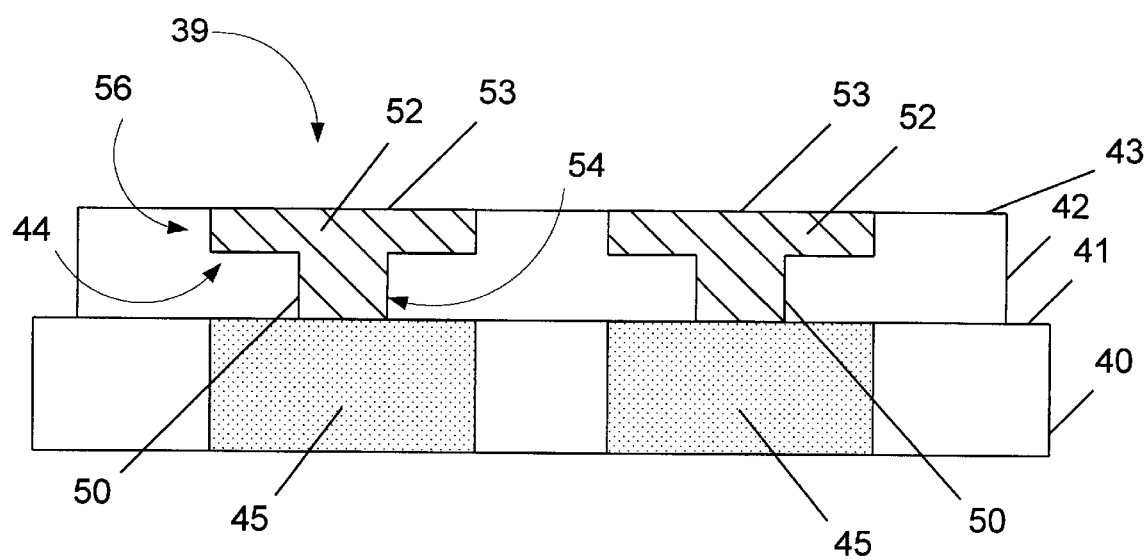
FIG. 8 is a cross-sectional view of the device depicted in FIG. 7 after a plurality of illustrative conductive interconnections have been formed in the openings in the underlying layer of dielectric material.

If desired, a barrier layer (not shown) comprised of, for example, titanium and titanium nitride, may be formed in the recess 44 and/or opening 50 prior to the formation of the conductive interconnections 52. The particular configuration, geometry and size of the conductive interconnection 52 that may be formed with the present invention may be varied as a matter of design choice. The portion of the illustrative conductive interconnection 52 depicted in FIG. 8 is comprised of a line portion 56 and a contact portion 54. However, the present invention may be used to form a variety of shapes and configurations, e.g., only a conductive line may be formed, only a conductive contact may be formed, etc.

Through use of the present invention, openings for conductive interconnections in dielectric layers may be formed smaller than traditional photolithography equipment and processes would allow. That is, through use of the present invention, conductive interconnections may be formed in openings in dielectric layers in areas defined by reduced size openings 48A formed in a layer of photoresist 46 using the reflow process described above. This in turn allows a more densely packed structure that reduce the size of various integrated circuit devices as well as improves electrical performance of such devices. Moreover, the present invention may be employed even as current photolithography processing equipment and techniques are improved so as to enable the definition of smaller and smaller feature sizes for generations of integrated circuit devices to come.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

forming a dielectric layer;

forming a recess in said dielectric layer;

forming a layer of photoresist above said layer of dielectric material and in said recess;

defining an opening in said layer of photoresist positioned above said recess, said opening having a first size;

heating said layer of photoresist to reduce the first size of said opening in said layer of photoresist;

forming an opening in said dielectric layer beneath said recess in said dielectric layer while using said layer of photoresist as a mask, said opening defined by said reduced size opening in said layer of photoresist;

removing said layer of photoresist; and forming a conductive interconnection in at least said opening and said recess.

2. The method of claim 1, wherein forming a dielectric layer comprises forming a dielectric layer comprised of at least one of silicon dioxide, fluorinated TEOS, carbon-doped oxides, and hydrogen silsesquioxane.

3. The method of claim 1, wherein forming a dielectric layer comprises forming a dielectric layer comprised of a material having a dielectric constant less than approximately four.

4. The method of claim 1, wherein forming a recess in said dielectric layer comprises etching a recess in said dielectric layer.

5. The method of claim 1, wherein forming a layer of photoresist above said layer of dielectric material and in said recess comprises spin coating a layer of photoresist above said layer of dielectric material and in said recess.

6. The method of claim 1, wherein defining an opening in said layer of photo resist positioned above said recess, said opening having a first size, comprises selectively exposing portions of said layer of photoresist to a light source to define an opening in said layer of photoresist positioned above said recess, said opening having a first size.

7. The method of claim 1, wherein heating said layer of photoresist to reduce the first size of said opening in said layer of photoresist comprises heating said layer of photoresist to a temperature ranging from approximately 100–200° C. for a duration ranging from approximately 10–240 seconds to reduce the first size of said opening in said layer of photoresist.

8. The method of claim 1, wherein forming an opening in said dielectric layer beneath said recess in said dielectric layer, said opening defined by said reduced size opening in said layer of photoresist, comprises etching an opening in said dielectric layer beneath said recess in said dielectric layer, said opening defined by said reduced size opening in said layer of photoresist.

9. The method of claim 1, wherein removing said layer of photoresist comprises performing a wet etching process to remove said layer of photoresist.

10. The method of claim 1, wherein forming a conductive interconnection in at least said opening and said recess comprises forming a conductive interconnection comprised of a metal in at least said opening and said recess.

11. The method of claim 1, wherein forming a conductive interconnection in at least said opening and said recess comprises forming a conductive interconnection comprised of at least one of copper, aluminun, and tungsten in at least said opening and said recess.

12. A method, comprising:

forming a dielectric layer comprised of a material having a dielectric constant less than approximately four;

etching a recess in said dielectric layer;

forming a layer of photoresist above said layer of dielectric material and in said recess;

defining an opening in said layer of photoresist positioned above said recess, said opening having a first size;

heating said layer of photoresist to a temperature ranging from approximately 100–200° C. for a duration ranging from approximately 10–240 seconds to reduce the size of said opening in said layer of photoresist;

etching an opening in said dielectric layer beneath said recess in said dielectric layer while using said layer of photoresist as a mask, said opening defined by said reduced size opening in said layer of photoresist;

removing said layer of photoresist; and forming a conductive interconnection in at least said opening and said recess.

13. The method of claim 12, wherein forming a dielectric layer comprised of a material having a dielectric constant less than approximately four comprises forming a dielectric layer comprised of at least one of silicon dioxide, fluorinated TEOS, carbon-doped oxides, and hydrogen silsesquioxane.

14. The method of claim 12, wherein forming a layer of photoresist above said layer of dielectric material and in said recess comprises spin coating a layer of photoresist above said layer of dielectric material and in said recess.

15. The method of claim 12, wherein removing said layer of photoresist comprises performing a wet etching process to remove said layer of photoresist.

16. The method of claim 12, wherein forming a conductive interconnection in at least said opening and said recess comprises forming a conductive interconnection comprised of a metal in at least said opening and said recess.

17. The method of claim 12, wherein forming a conductive interconnection in at least said opening and said recess comprises forming a conductive interconnection comprised of at least one of copper, aluminum, and tungsten in at least said opening and said recess.

18. A method, comprising:

forming a dielectric layer;

forming a recess in said dielectric layer, said recess having a first width;

forming a layer of photoresist above said layer of dielectric material and in said recess;

defining an opening in said layer of photoresist positioned above said recess, said opening having a first size;

heating said layer of photoresist to reduce the first size of said opening in said layer of photoresist;

forming an opening in said dielectric layer beneath said recess in said dielectric layer while using said layer of photoresist as a mask, said opening defined by said reduced size opening in said layer of photoresist, said opening having a second width that is less than said first width of said recess;

removing said layer of photoresist; and forming a conductive interconnection in at least said opening and said recess.

19. The method of claim 18, wherein forming a dielectric layer comprises forming a dielectric layer comprised of at least one of silicon dioxide, fluorinated TEOS, carbon-doped oxides, and hydrogen silsesquioxane.

20. The method of claim 18, wherein forming a dielectric layer comprises forming a dielectric layer comprised of a material having a dielectric constant less than approximately four.

21. The method of claim 18, wherein forming a recess in said dielectric layer comprises etching a recess in said dielectric layer.

22. The method of claim 18, wherein forming a layer of photoresist above said layer of dielectric material and in said recess comprises spin coating a layer of photoresist above said layer of dielectric material and in said recess.

23. The method of claim 18, wherein defining an opening in said layer of photoresist positioned above said recess, said opening having a first size, comprises selectively exposing portions of said layer of photoresist to a light source to define an opening in said layer of photoresist positioned above said recess, said opening having a first size.

24. The method of claim 18, wherein heating said layer of photoresist to reduce the first size of said opening in said layer of photoresist comprises heating said layer of photoresist to a temperature ranging from approximately 100–200° C. for a duration ranging from approximately 10–240 seconds to reduce the first size of said opening in said layer of photoresist.

25. The method of claim 18, wherein forming an opening in said dielectric layer beneath said recess in said dielectric layer, said opening defined by said reduced size opening in said layer of photoresist, comprises etching an opening in said dielectric layer beneath said recess in said dielectric layer, said opening defined by said reduced size opening in said layer of photoresist.

26. The method of claim 18, wherein removing said layer of photoresist comprises performing a wet etching process to remove said layer of photoresist.

27. The method of claim 18, wherein forming a conductive interconnection in at least said opening and said recess comprises forming a conductive interconnection comprised of a metal in at least said opening and said recess.

28. The method of claim 18, wherein forming a conductive interconnection in at least said opening and said recess comprises forming a conductive interconnection comprised of at least one of copper, aluminum, and tungsten in at least said opening and said recess.

29. A method, comprising:
forming a dielectric layer;
etching a recess in said dielectric layer, said recess having a first width;
forming a layer of photoresist above said layer of dielectric material and in said recess;

defining an opening in said layer of photoresist positioned above said recess, said opening having a first size;

heating said layer of photoresist to a temperature ranging from approximately 100–200° C. to reduce the first size of said opening in said layer of photoresist;

etching an opening in said dielectric layer beneath said recess in said dielectric layer while using said layer of photoresist as a mask, said opening defined by said reduced size opening in said layer of photoresist, said opening having a second width that is less than said first width of said recess;

removing said layer of photoresist; and forming a conductive interconnection in at least said opening and said recess.

30. The method of claim 29, wherein forming a dielectric layer comprises forming a dielectric layer comprised of at least one of silicon dioxide, fluorinated TEOS, carbon-doped oxides, and hydrogen silsesquioxane.

31. The method of claim 29, wherein forming a dielectric layer comprises forming a dielectric layer comprised of a material having a dielectric constant less than approximately four.

32. The method of claim 29, wherein forming a layer of photoresist above said layer of dielectric material and in said recess comprises spin coating a layer of photoresist above said layer of dielectric material and in said recess.

33. The method of claim 29, wherein defining an opening in said layer of photoresist positioned above said recess, said opening having a first size, comprises selectively exposing portions of said layer of photoresist to a light source to define an opening in said layer of photoresist positioned above said recess, said opening having a first size.

34. The method of claim 29, wherein heating said layer of photoresist to a temperature ranging from approximately 100–200° C. to reduce the first size of said opening in said layer of photoresist comprises heating said layer of photoresist for a duration ranging from approximately 10–240 seconds to reduce the first size of said opening in said layer of photoresist.

35. The method of claim 29, wherein removing said layer of photoresist comprises performing a wet etching process to remove said layer of photoresist.

36. The method of claim 29, wherein forming a conductive interconnection in at least said opening and said recess comprises forming a conductive interconnection comprised of a metal in at least said opening and said recess.

37. The method of claim 29, wherein forming a conductive interconnection in at least said opening and said recess comprises forming a conductive interconnection comprised of at least one of copper, aluminum, and tungsten in at least said opening and said recess.

* * * * *